(12) United States Patent  
Acar et al.

(10) Patent No.: US 7,519,526 B2  
(45) Date of Patent: Apr. 14, 2009

(54) CHARGE-BASED CIRCUIT ANALYSIS

(75) Inventors: Emrah Acar, Montvale, NJ (US);  
Bhavna Agrawal, Ennetbaden (CH);  
Peter Feldmann, New York, NY (US);  
Ying Liu, Austin, TX (US); Steven G. Walker, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 11/355,342

(22) Filed: Feb. 16, 2006

(65) Prior Publication Data

US 2007/0225958 A1    Sep. 27, 2007

(51) Int. Cl.  
*G06F 17/50* (2006.01)

(52) U.S. Cl. ....................................................... 703/14

(58) Field of Classification Search .................... 703/14  
See application file for complete search history.

(56) References Cited

U.S. PATENT DOCUMENTS 6,023,577 A * 2/2000 Smith et al. .................... 703/14

OTHER PUBLICATIONS

Ching-Te Chuang et al. "SOI for Digital CMOS VLSI: Design Considerations and Advances". Proceedings of the IEEE, vol. 86, No. 4, Apr. 1998, pp. 689-720.

Goering, R., SOI sets sights on the ASIC market. EE Times (Aug. 29, 2005), 2 pages.

Hofstee, P. et al., "MP 5.4 A 1GHz Single-Issue 64b PowerPC Processor". 2000 IEEE International Solid-State Circuits Conference, 2 pages.

Lu, Pong-Fei et al, "Floating-Body Effects in Partially Depleted SOI CMOS Circuits". IEEE Journal of Solid-State Circuits, vol. 32, No. 8, Aug. 1997, pp. 1241-1253.

Vladimirescu, A. et al., "SPICE Version 2G User's Guide". Department of Electrical Engineering and Computer Sciences, University of California, Berkeley, Aug. 10, 1981, pp. 1-41, 44-50.

Shahidi, G. G., "SOI technology for the GHz era". IBM J. Res. & Dev., vol. 46, No. 2/3, Mar./May 2002, pp. 121-131.

* cited by examiner

*Primary Examiner*—Paul L Rodriguez  
*Assistant Examiner*—Luke Osborne  
(74) *Attorney, Agent, or Firm*—Brian Verminski

(57) ABSTRACT

A solution for analyzing a circuit using initial charge information is provided. In particular, one or more nodes in a design for the circuit is initialized with an initial charge. The charge can comprise a non-equilibrium charge, thereby simulating the history effect, the impact of a charged particle, electro-static discharge (ESD), and/or the like. Operation of the circuit is then simulated over the set of input cycles based on the initial charge(s). To this extent, the non-equilibrium initial condition solution enables the state of the circuit to be controlled and solves the initial system based on these values. This capability is very useful to condition the circuit at a worst-case, best-case, and/or the like, status. Further, in one embodiment of the invention, a set of equations are provided to implement the non-equilibrium initial charge analysis, which provide a more efficient initialization of the circuit than current solutions.

3 Claims, 7 Drawing Sheets

CHARGE-BASED CIRCUIT ANALYSIS

FIELD OF THE INVENTION

The invention relates generally to circuit analysis, and more particularly, to a solution for simulating circuit behavior based on a charge of a node in a design for the circuit.

BACKGROUND OF THE INVENTION

An important step in developing a circuit is analyzing a design of the circuit. The analysis can be used to detect design weaknesses/flaws in the circuit, which can be fixed prior to building and testing the circuit. Further, the analysis can be used to characterize one or more performance attributes of the circuit, such as a standard circuit block, which then can be used when analyzing a larger circuit, in which the standard circuit block is included. To this extent, an accurate analysis of a design is important to reducing the overall cost to produce the circuit and/or increasing the performance/quality of the circuit.

One challenge to accurate analysis is known as the "history effect". The history effect refers to the fact that one or more performance attributes of the circuit is impacted by a large number of the previous execution cycles. For example, in a Silicon-on-Insulator (SOI) transistor, a body (or base) node is generally only connected to the remainder of the circuit through reverse biased p-n junctions and/or other similarly weak leakage mechanisms. To this extent, the body node is largely insulated from the rest of the circuit and only weak direct currents are possible to and from the body node. As a result, any charge at the body node will accumulate/dissipate at a far slower rate (e.g., orders of magnitude slower) than the operation of the circuit, and the charge of any body node will be a function of what occurred during thousands of the previous execution cycles. However, an amount of the charge at the body node exerts a strong effect on one or more performance attributes (e.g., threshold voltage) of the transistor, which in turn impacts the overall circuit performance.

In general, current circuit simulators determine a voltage at each node in the circuit by solving for the DC equilibrium of the circuit. For each node on a SOI transistor, this requires solving a matrix that includes the voltages at each adjacent node in the circuit. Since the body node is largely insulated from the rest of the circuit, these matrices are ill-conditioned, increasing the number of iterations required to achieve a solution. Further, this initialization is not always the most interesting (e.g., not the worst case, best case, or typical) or most likely state of the circuit.

Various solutions allow the state of one or more nodes to be initialized. In particular, based on previous electrical analysis, voltage-current tables are constructed, which then are used to initialize various node voltages according to desired circuit behavior. These tables feed controlled current sources connected to the node releasing the necessary current flow at its initial state. Though this solution is useful and feasible with available circuit simulators, it suffers from an explosion of data volume for the required tables, long processing time to characterize the tables, an implicit ill-conditioning of the matrices used in the circuit simulators, a loss of insight into the physical phenomenon, and/or the like.

In view of the foregoing, there exists a need in the art to overcome one or more of the indicated deficiencies and/or one or more other deficiencies not expressly discussed herein.

BRIEF SUMMARY OF THE INVENTION

The invention provides a solution for analyzing a circuit using initial charge information. In particular, one or more nodes in a design for the circuit is initialized with an initial charge. The charge can comprise a non-equilibrium charge, thereby simulating the history effect, the impact of a charged particle, electro-static discharge (ESD), and/or the like. Operation of the circuit is then simulated over a set of input cycles based on the initial charge(s). To this extent, the non-equilibrium initial condition solution enables the state of the circuit to be controlled and solves the initial system based on these values. This capability is very useful to condition the circuit at a worst-case, best-case, and/or the like, status. Further, in one embodiment of the invention, a set of equations are provided to implement the non-equilibrium initial charge analysis, which provide a more efficient initialization of the circuit than current solutions.

A first aspect of the invention provides a method of analyzing a circuit, the method comprising: obtaining a design for the circuit, the design including a set of nodes; defining an initial charge for at least one of the set of nodes; and simulating operation of the circuit over a set of input cycles based on the initial charge for the at least one of the set of nodes.

A second aspect of the invention provides a system for analyzing a circuit, the system comprising: a system for obtaining a design for the circuit, the design including a set of nodes; a system for defining an initial charge for at least one of the set of nodes; and a system for simulating operation of the circuit over a set of input cycles based on the initial charge for the at least one of the set of nodes.

A third aspect of the invention provides a program product stored on a computer-readable medium, which when executed, enables a computer infrastructure to analyze a circuit, the program product comprising computer program code for enabling the computer infrastructure to: obtain a design for the circuit, the design including a set of nodes; define an initial charge for at least one of the set of nodes; and simulate operation of the circuit over a set of input cycles based on the initial charge for the at least one of the set of nodes.

A fourth aspect of the invention provides a method of generating a system for analyzing a circuit, the method comprising: providing a computer infrastructure operable to: obtain a design for the circuit, the design including a set of nodes; define an initial charge for at least one of the set of nodes; and simulate operation of the circuit over a set of input cycles based on the initial charge for the at least one of the set of nodes.

A fifth aspect of the invention provides a business method for analyzing a circuit, the business method comprising managing a computer infrastructure that performs the process described herein; and receiving payment based on the managing.

The illustrative aspects of the present invention are designed to solve one or more of the problems herein described and/or one or more other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention, in which.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

For convenience, the Detailed Description of the Invention includes the following sections:
I. General Description
II. Computerized Implementation
III. Illustrative Process
IV. Theoretical Support
V. Comparison with Traditional Analysis
VI. Illustrative Applications
VII. Alternatives I. General Description As indicated above, the invention provides a solution for analyzing a circuit using initial charge information. In particular, one or more nodes in a design for the circuit is initialized with an initial charge. The charge can comprise a non-equilibrium charge, thereby simulating the history effect, the impact of a charged particle, electro-static discharge (ESD), and/or the like. Operation of the circuit is then simulated over a set of input cycles based on the initial charge(s). To this extent, the non-equilibrium initial condition solution enables the state of the circuit to be controlled and solves the initial system based on these values. This capability is very useful to condition the circuit at a worst-case, best-case, and/or the like, status. Further, in one embodiment of the invention, a set of equations are provided to implement the non-equilibrium initial charge analysis, which provide a more efficient initialization of the circuit than current solutions. As used herein, unless otherwise noted, the term "set" means one or more.

II. Computerized Implementation

Figure 1:
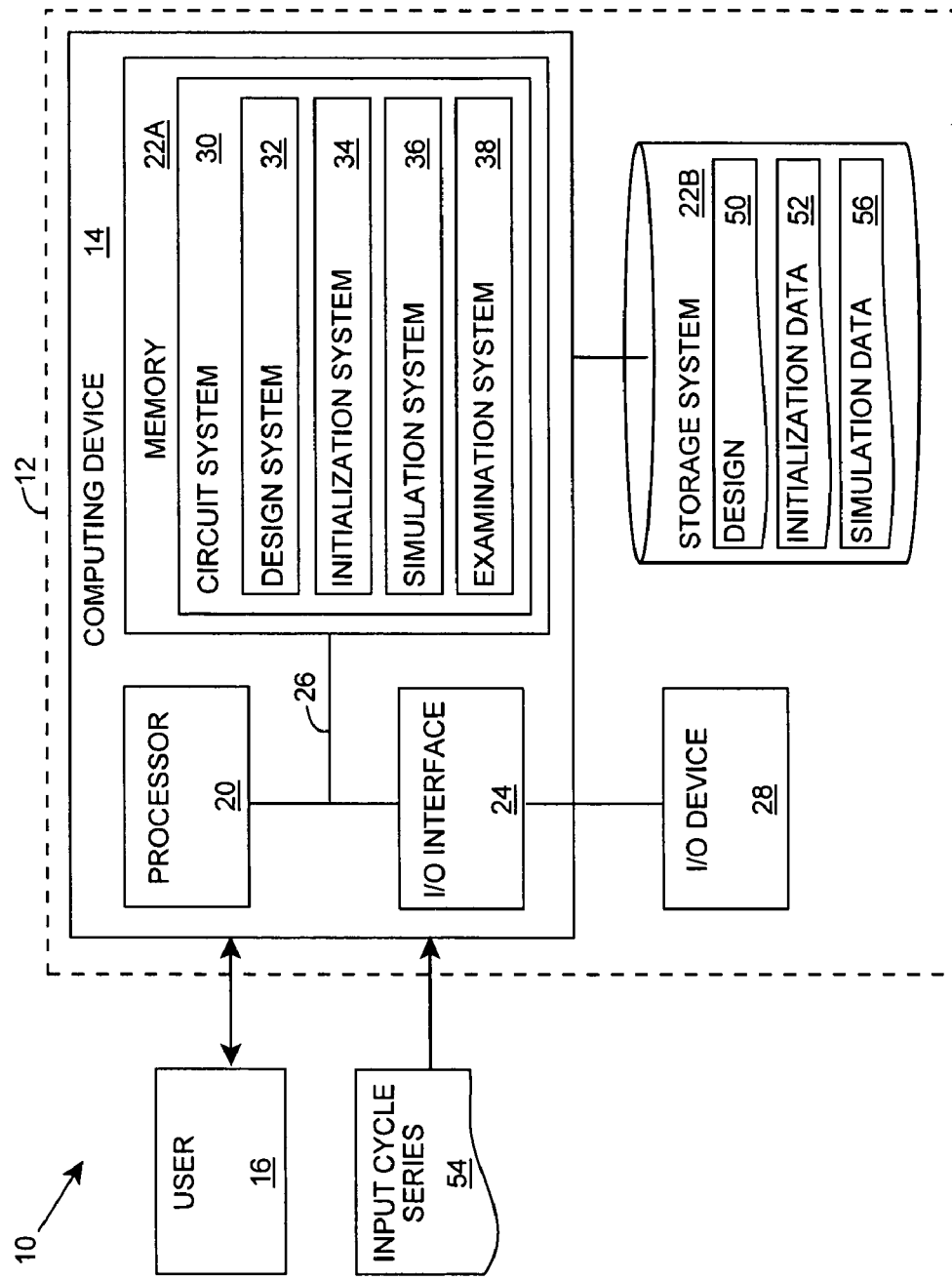
FIG. 1 shows an illustrative environment for analyzing a circuit according to an embodiment of the invention.

Turning to the drawings, FIG. 1 shows an illustrative environment 10 for analyzing a circuit according to an embodiment of the invention. To this extent, environment 10 includes a computer infrastructure 12 that can perform the process described herein in order to analyze the circuit. In particular, computer infrastructure 12 is shown including a computing device 14 that comprises a circuit system 30, which makes computing device 14 operable to analyze the circuit by performing the process described herein.

Computing device 14 is shown including a processor 20, a memory 22A, an input/output (I/O) interface 24, and a bus 26. Further, computing device 14 is shown in communication with an external I/O device/resource 28 and a storage system 22B. As is known in the art, in general, processor 20 executes computer program code, such as circuit system 30, which is stored in memory 22A and/or storage system 22B. While executing computer program code, processor 20 can read and/or write data, such as design 50, to/from memory 22A, storage system 22B, and/or I/O interface 24. Bus 26 provides a communications link between each of the components in computing device 14. I/O device 28 can comprise any device that enables an individual to interact with computing device 14 or any device that enables computing device 14 to communicate with one or more other computing devices using any type of communications link.

In any event, computing device 14 can comprise any general purpose computing article of manufacture capable of executing computer program code installed thereon (e.g., a personal computer, server, handheld device, etc.). However, it is understood that computing device 14 and circuit system 30 are only representative of various possible equivalent computing devices that may perform the process described herein. To this extent, in other embodiments, the functionality provided by computing device 14 and circuit system 30 can be implemented by a computing article of manufacture that includes any combination of general and/or specific purpose hardware and/or computer program code. In each embodiment, the program code and hardware can be created using standard programming and engineering techniques, respectively.

Similarly, computer infrastructure 12 is only illustrative of various types of computer infrastructures for implementing the invention. For example, in one embodiment, computer infrastructure 12 comprises two or more computing devices (e.g., a server cluster) that communicate over any type of communications link, such as a network, a shared memory, or the like, to perform the process described herein. Further, while performing the process described herein, one or more computing devices in computer infrastructure 12 can communicate with one or more other computing devices external to computer infrastructure 12 using any type of communications link. In either case, the communications link can comprise any combination of various types of wired and/or wireless links; comprise any combination of one or more types of networks (e.g., the Internet, a wide area network, a local area network, a virtual private network, etc.); and/or utilize any combination of various types of transmission techniques and protocols.

As discussed herein, circuit system 30 enables computer infrastructure 12 to analyze a circuit. To this extent, circuit system 30 is shown including a design system 32, an initialization system 34, a simulation system 36, and an examination system 38. Operation of each of these systems is discussed further herein. However, it is understood that some of the various systems shown in FIG. 1 can be implemented independently, combined, and/or stored in memory for one or more separate computing devices that are included in computer infrastructure 12. Further, it is understood that some of the systems and/or functionality may not be implemented, or additional systems and/or functionality may be included as part of computer infrastructure 12.

Regardless, the invention provides a solution for analyzing a circuit. To this extent, design system 32 can manage a set of designs 50 for various circuits. Each design 50 comprises data that defines some/all of a circuit, such as an integrated circuit. To this extent, each design 50 can comprise a set of nodes and a set of connections between the various nodes. In one embodiment, nodes in design 50 are defined at the transistor level. For example, design 50 can comprise a set of transistors, such as Silicon-on-Insulator (SOI) transistors, and the nodes in design 50 can comprise the various nodes on each transistor (e.g., gate node, source node, drain node, and body (or base) node). However, it is understood that this is only illustrative, and each node can be defined at any level of detail for circuit, e.g., gate-level (e.g., AND, OR, NAND, etc.), functional component-level (e.g., switch, sensor, diode, etc.), and/or the like. The connections between the various nodes define paths of the circuit. Each path comprises a unique set of nodes through which a signal travels from a starting point (e.g., an input pin) to an ending point (e.g., an output, such as a latch or a primary output).

In general, design system 32 can receive and/or send a design 50 from/to one or more users 16 and/or perform one or more operations (e.g., create, display, modify, delete, etc.) to design 50 in response to a request from user 16. User 16 can comprise an individual, in which case design system 32 can generate a user interface that, when displayed to user 16, enables user 16 to view/modify design 50. Further, user 16 can comprise another system, in which case, design system 32 can implement an application program interface (API) or the like, that enables user 16 to communicate request(s) for data/operations to design system 32 and receive data on design(s) 50 from design system 32. In any event, design system 32 can store each design 50 using any data storage solution, e.g., as one or more data files, record(s) in a database, and/or the like.

III. Illustrative Process

Figure 2:
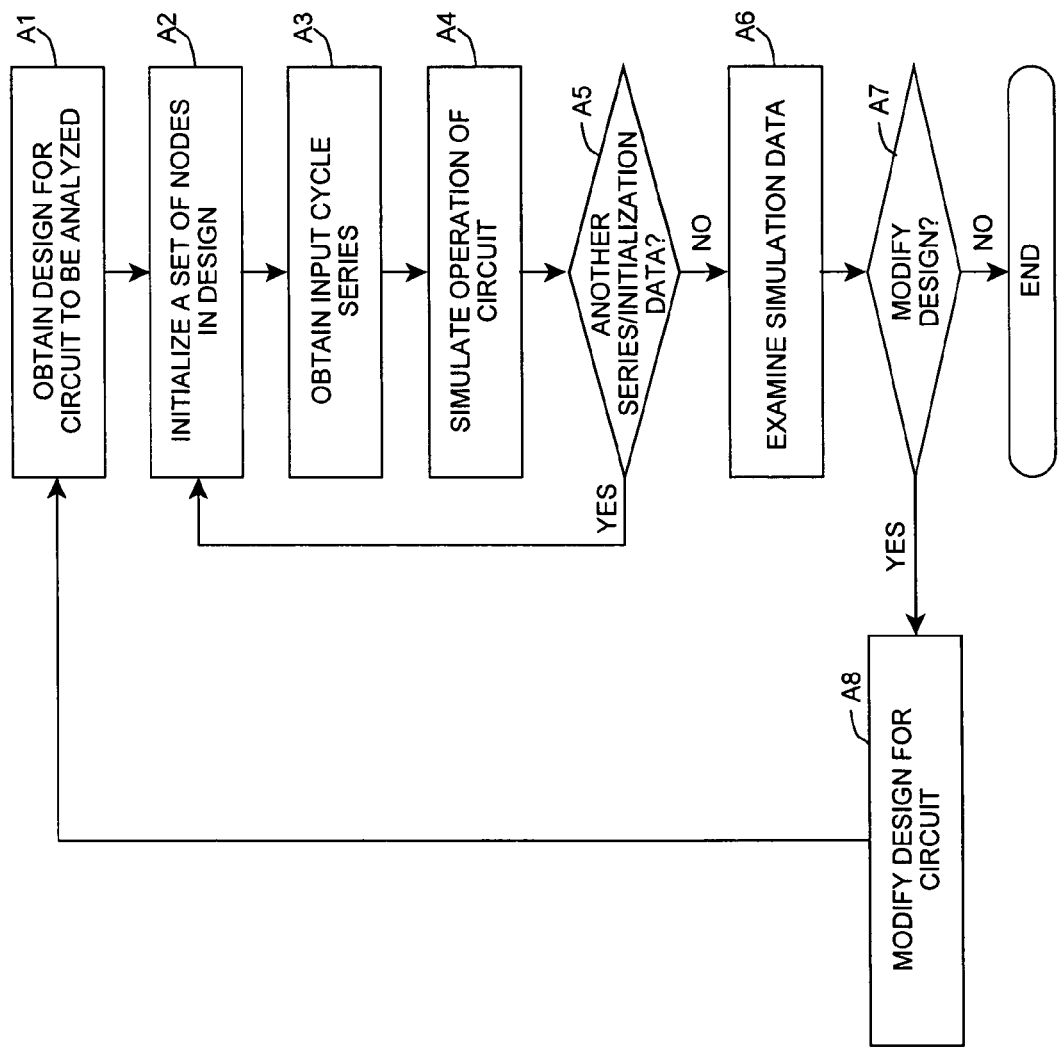
FIG. 2 shows an illustrative process that can be implemented by the computer infrastructure of FIG. 1.

FIG. 2 shows an illustrative process that can be implemented by the computer infrastructure 12 of FIG. 1. Referring to FIGS. 1 and 2, in step A1, design system 32 can obtain a design 50, which user 16 desires analyzed. To this extent, user 16 could provide (e.g., communicate) design 50 to design system 32, design system 32 can retrieve design 50 from a storage device 22B, and/or the like.

In step A2, initialization system 34 can initialize a set of nodes in design 50. To this extent, initialization system 34 can generate and/or obtain initialization data 52 for design 50. Initialization data 52 can define one or more electrical characteristics of some or all of the nodes in design 50. For example, initialization system 34 can automatically determine a voltage and/or a charge at each node based on the direct current (DC) equilibrium for each path defined in design 50. Further, initialization system 34 can obtain some or all of initialization data 52 from user 16 (e.g., via a user interface, API, and/or the like). In this case, initialization system 34 can use the initialization data 52 received from user 16 in determining one or more electrical characteristics (e.g., voltage, charge, and/or the like) of other nodes in design 50 based on the DC equilibrium.

However, for some nodes in design 50, the initialization data 52 can define a non-equilibrium initial condition. For example, for one or more body nodes in design 50, initialization data 52 can define an initial charge that comprises a non-equilibrium charge. The non-equilibrium initial charge(s) can be selected to based on a desired analysis of design 50. For example, the non-equilibrium initial charge can be selected to provide a desired behavior, such as a best performance, a worst performance, a typical performance, and/or the like, for a performance attribute (e.g., delay, slew, power consumption, leakage, and/or the like) of the circuit. In one embodiment, initialization system 34 can derive a non-equilibrium initial charge for a particular body node based on a voltage matrix for the body node that is known to provide the desired performance attribute.

In any event, in step A3, simulation system 36 can obtain input cycle series 54 (e.g., from user 16, storage system 22B, and/or the like). Input cycle series 54 can define a set of cycles, each cycle comprising an input value for each of one or more inputs (e.g., an input pin) to the circuit. Input cycle series 54 can comprise a random series of values or be selected to test operation of the circuit under various conditions. For example, input cycle series 54 could comprise a series of alternating zero and one input values to simulate the operation of the circuit under constant switching, could comprise a set of cycles that illustrate typical operation, and/or the like.

In step A4, simulation system 36 simulates operation of the circuit over the set of input cycles defined in input cycle series 54. In particular, for each cycle, simulation system 36 can use the input value(s) to propagate an affect of the input value(s) on each node in design 50. For example, simulation system 36 can adjust one or more electrical characteristics of one or more of the nodes in design 50, and propagate the adjustments along each path in design 50. Simulation system 36 can repeat this process for each cycle defined in input cycle series 54. Further, simulation system 36 can simulate operation of the circuit for multiple input cycle series 54 and/or initialization data 52. To this extent, in step A 5, simulation system 36 can determine whether another input cycle series 54 and/or initialization data 52 is to be processed, and if so, flow can return to step A2, in which initialization system 34 again initializes a set of nodes in design 50.

During and/or after each simulation, simulation system 36 can generate simulation data 56. Simulation data 56 can comprise data on one or more performance attributes of design 50. For example, simulation data 56 can comprise a set of output values, a set of electrical characteristics for one or more nodes, a power consumption and/or leakage of a node/the circuit, an amount of time the node/circuit took to process each cycle (e.g., delay), an amount of time required for the node/circuit to change an output state (e.g., slew), and/or the like.

In step A6, examination system 38 can examine simulation data 56. As discussed herein, examination system 38 can examine simulation data 56 for any application. For example, design 50 can comprise a design for a standard circuit block, and examination system 38 can identify one or more performance attributes of the circuit block, such as a delay, a slew, a power consumption, a leakage, and/or the like. Further, examination system 38 can generate a behavioral model for the circuit based on one or more of the performance attributes. In this case, the behavioral model can capture the extremes of behavior of the circuit, such as the best, worst, and/or typical performance of the circuit with respect to one or more of performance attributes.

Still further, examination system 38 can determine the effect of various transient events. For example, examination system 38 can determine an effect of an electrostatic discharge on the circuit. In this case, initialization data 52 can define an initial charge/voltage for an input and/or node in design 50, which simulates the electrostatic discharge. Additionally, examination system 38 can determine an affect of that a charged particle might have on circuit. To this extent, initialization data 52 can define an initial charge that simulates a charge particle striking a particular node in design 50. In either case, simulation system 36 can perform at least two simulations with design 50. In one simulation, the initialization data 52 can define a typical or base set of electrical characteristics, while in the second simulation, the initialization data 52 can define substantially the same set of electrical characteristics with one or more characteristics (e.g., a charge on a node) modified to simulate the transient event.

Circuit system 30 can implement the initialization, simulation, and/or examination process as part of a larger process for creating and/or refining design 50. To this extent, in step A7, examination system 38 can determine if any modification(s) to design 50 are desired. For example, examination system 38 can provide performance attribute(s), the behavioral model, and/or transient event effect(s) for use by user 16. Subsequently, user 16 can indicate whether design 50 requires modification. If so, then in step A8, design system 32 and/or another system external to circuit system 30 can modify design 50, and flow can return to step A1, in which the modified design 50 is provided for analysis. Otherwise, the process can complete. Subsequently, a circuit can be manufactured using design 50.

IV. Theoretical Support

As discussed herein, contrary to prior art circuit analysis solutions, the invention provides a charge-based solution. In particular, in step A2, an initial charge (e.g., a non-equilibrium charge) can be defined for one or more nodes in a design of the circuit. In step A4, operation of the circuit is simulated based on the initial charge(s). However, current simulation solutions are limited to voltage-based analysis of the design. To this extent, a new set of charge-based equations is required. The following discussion provides theoretical support for one set of charge-based equations according to an embodiment of the invention.

Kirchoff's Current Law (KCL) is a consequence of the continuity equation:

$$\nabla J + \frac{\delta \rho}{\delta t} = 0 \qquad \text{Equation 1}$$

where J is the current density and $\rho$ is the charge density at a point in space. More precisely, KCL is derived from an integral form of Equation 1, which states that for any closed surface, S, enclosing a volume, V:

$$\int_S \vec{J} \cdot \vec{ds} = -\int_V \frac{d\rho}{dt} dv. \qquad \text{Equation 2}$$

In a lumped-element circuit model, the left term becomes a sum of currents that intersect the closed surface S. The cross-sections of the circuit elements generated by their intersection with the original closed surface S can be denoted as $S_k$, k=1 . . . n. The current density is assumed to be zero outside these cross-sections, yielding:

$$\int_S \vec{J} \cdot \vec{ds} = \sum_{k=1}^{n} \int_{S_k} \vec{J} \cdot \vec{ds} = \sum_{k=1}^{n} I_k. \qquad \text{Equation 3}$$

Furthermore, in the lumped-element circuit model, nodes cannot contain charge, and therefore, for any closed surface surrounding a node, the second term of Equation 2 must be zero. Moreover, it can be shown, more generally, that the second term is zero for any closed surface that does not separate capacitor plates. The result is Kirchhoff's Current Law, which is valid for these closed surfaces:

$$\sum_{k=1}^{n} I_k = 0. \qquad \text{Equation 4}$$

However, when a set of initial charges are assigned to one or more nodes, the assumptions used to derive KCL are no longer valid. For example, in Equation 2, the second term becomes:

$$\int_V \frac{d\rho}{dt} dv = \frac{d}{dt} \int_V \rho \, dv = \frac{dQ}{dt} = i_q, \qquad \text{Equation 5}$$

a current quantity, reflecting the rate of change of the charge(s) on the node(s). In fact, there is no contradiction between this model and the standard lumped-element circuit model. In the latter, charges are assumed to accumulate only on the plates of the lumped capacitors. The same expression for the nodal current is obtained by extending the boundary of the nodal cross-section to include all capacitor plates directly adjacent to the node.

The original circuit differential equations can be assumed to be:

$$f(x, t) + \frac{d}{dt} q(x) = 0, \qquad \text{Equation 6}$$

where f(x,t) represents a contribution of the sources and dissipative elements, and q(x) represents the contribution of reactive elements. Transient analysis amounts to integrating this system of differential-algebraic equations. An initial step of this analysis includes determining a set of consistent and physically meaningful initial conditions for the state-vector x. Sometimes, misleadingly referred to as "DC analysis". One reason for this naming is that in most cases the assumption is made that prior to the start of simulation all state variables are in equilibrium and constant, making the right term in Equation 6 zero. In this case, the initial state is obtained by solving the DC equations:

$$f(x, t_0) = 0. \qquad \text{Equation 7}$$

While this may be the case, the goal is not to find a steady-state solution for the circuit, but rather to define a set of consistent and physically meaningful initial conditions for the state-vector, x.

To this extent, a non-equilibrium system of equations is required. For the case in which an initial charge $q_0$ is specified for a particular node k, the KCL for node k, for which the initial charge may not be in equilibrium, includes an additional current-like term, $i_{q,k}$. Assuming a nodal-analysis type formulation, and that the k-th equation in the system is the KCL for this node, the DC Equations 7 can be augmented with:

$$f(x, t_0) + e_k i_{q,k} = 0, \qquad \text{Equation 8}$$

where $e_k$ represents the k-th unit vector. The additional unknown requires an additional equation for the system to remain solvable, which can comprise the charge imposition on node k. The resulting system can be solved $$f(x,t_0)+e_k i_{q,k}=0,$$

$$e_k^T q(x) - q_0 = 0, \quad \text{Equation 9}$$

Moreover, only the k-th equation requires the new variable $i_{q,k}$. Changing the order of the equations in the system does not affect the solution. Therefore, the k-th and last equation can be interchanged. In this manner, the subsystem formed by leaving out the equation that became last is square and solvable in the original unknowns x. Once x is known, the equation that became last can provide the value of the current $i_{q,k}$. In this case, the subsystem in x is the original DC system of equations, with the dissipative part of the nodal equation for node k is replaced by the charge equilibrium equation. To this extent, in order to implement non-equilibrium initial conditions in prior art simulators, for each charge-initialized node, the KCL equation can be replaced with the charge equilibrium Equation 9, and the resulting system can be solved. The nodal charge current will comprise an amount by which the replaced KCLs are not satisfied.

To show that the resulting non-equilibrium initial conditions are consistent, i.e., $$f(x, t_0) + \frac{d}{dt}q(x)\bigg|_{t=t_0} = 0 \quad \text{Equation 10}$$

some algebraic manipulations are performed to yield:

$$f(x, t_0) + \underbrace{\frac{\delta q}{\delta x}\bigg|_{t=t_0}}_{C_0} \frac{d}{dt}x = 0, \quad \text{Equation 11}$$

$$\underbrace{f(x, t_0) + e_k i_{q,k}}_{=0} - e_k i_{q,k} + C_0 \frac{d}{dt}x = 0,$$

which means that $$C_0 \frac{d}{dt}x = e_k i_{q,k}$$

must have at least one solution. This is true as long as $e_k$ is in the range of $C_0$, which is always the case in practice. In particular, the contrary only occurs when an initial charge is imposed to a node having no capacitive element attached to it. This approach can be generalized to an instance in which multiple nodes are specified to have an initial charge.

V. Comparison with Traditional Analysis

In one embodiment, support for non-equilibrium initial conditions was implemented in a circuit simulator that supports conventional circuit analysis with BSIMSOI models via a standard MNA formulation. In this case, analysis that supports the non-equilibrium initial conditions can be made optional, enabling circuit analysis with explicitly initialized body charges and traditional body initialization. To this extent, a circuit comprising a medium size inverter with a P/N transistor width ratio of two, which was developed using a 130 nm IBM SOI integration technology device model was simulated using both analyses. During simulation, the inverter was driven by a pulse signal with an initial value of zero.

Figure 3:
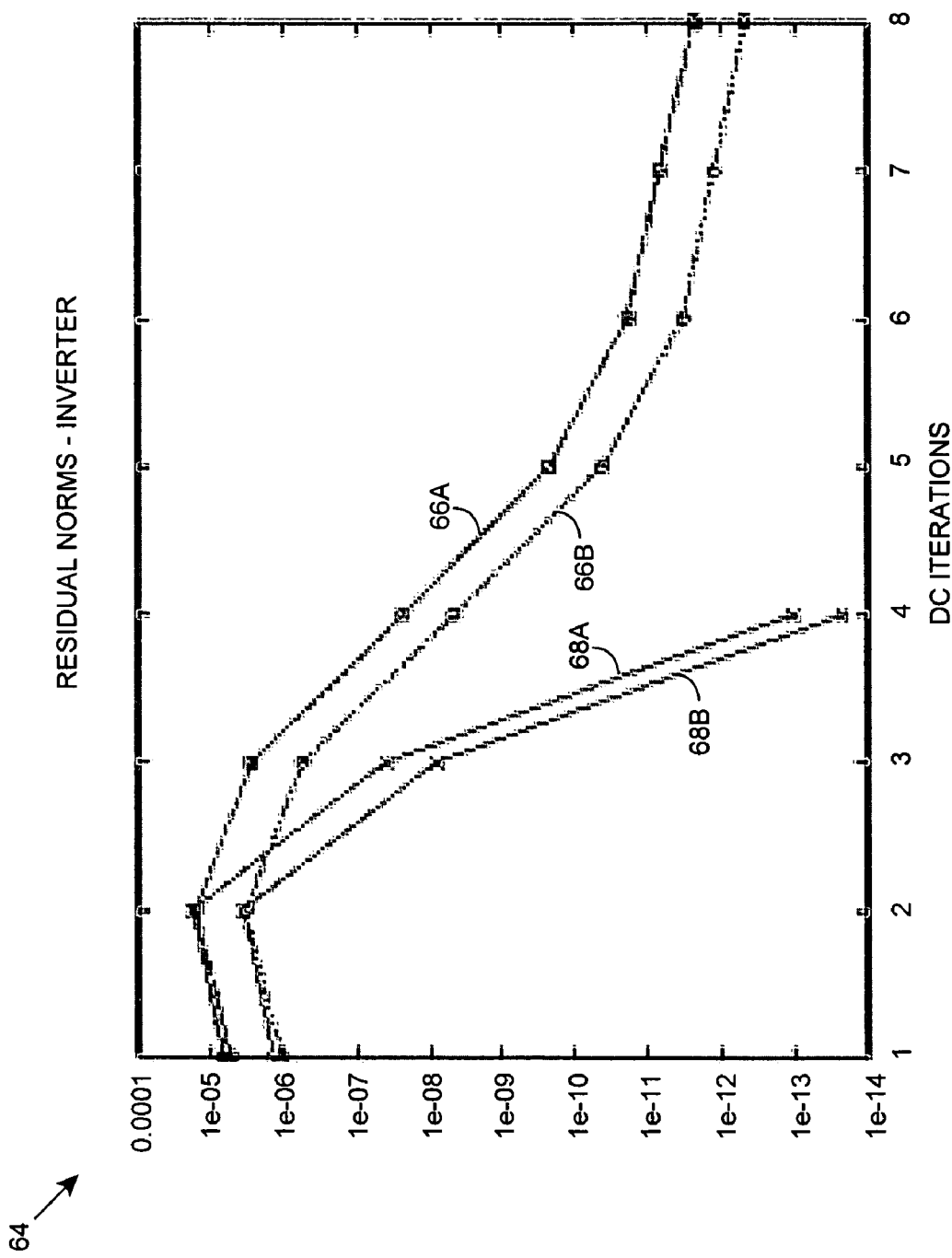
FIG. 3 shows a chart that illustrates the convergence of traditional body initialization versus non-equilibrium initialization according to an embodiment of the invention.

Using the traditional body node initialization (DC initialization), the equilibrium equations at the body nodes, which involve only the small pn-junction current, deteriorate the condition number of the Jacobian matrix. Regardless, the robust DC analysis algorithm found the solution in eight Newton steps. However, using the non-equilibrium initial conditions, the resulting matrices are better conditioned in the transient initialization step, which converges in four iterations using the same Newton algorithm. FIG. 3 shows a chart 64 that illustrates the convergence of two illustrative traditional body initializations 64A-B and a corresponding two illustrative non-equilibrium initializations 66A-B, respectively. As shown in chart 64, the convergence behavior of the non-equilibrium initializations 66A-B are superior to the traditional body initializations 64A-B.

Once initialized, the circuit was analyzed using both solutions for a number of cycles using standard transient analysis. Both solutions provided substantially the same transient response analyses. However, in addition to a more efficient initialization, the non-equilibrium initial condition solution enables the body node charges to be controlled and solves the initial system based on these values. This capability is very useful to condition the circuit at a worst-case, best-case, and/or the like, status.

V. Illustrative Applications

Figure 4A:
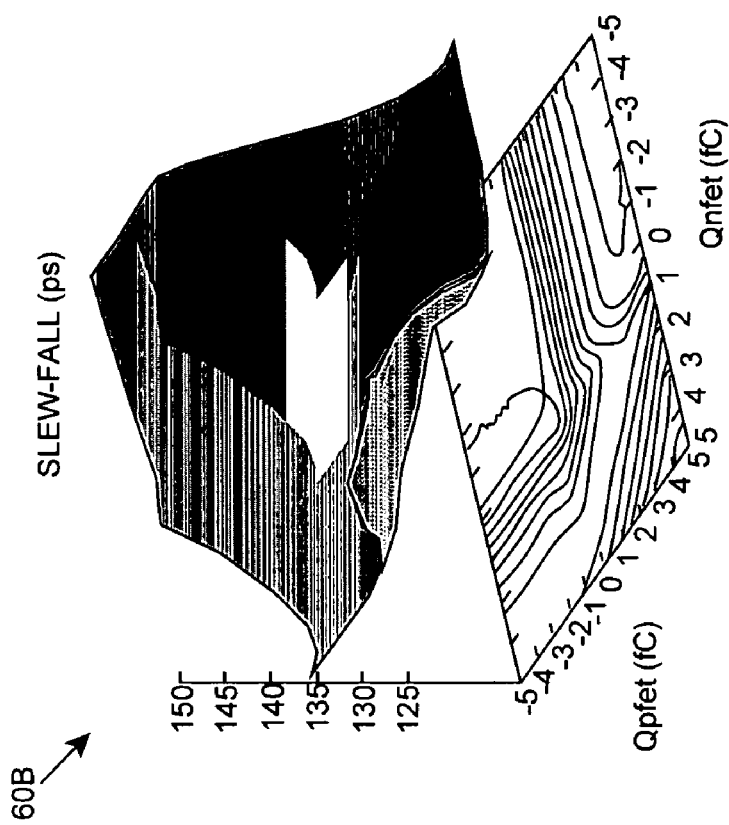
FIGS. 4A-B show illustrative graphs of delay and slew, respectively, versus initial charges for body nodes of PFET and NFET transistors in a digital inverter standard circuit block according to an embodiment of the invention.
Figure 4B:
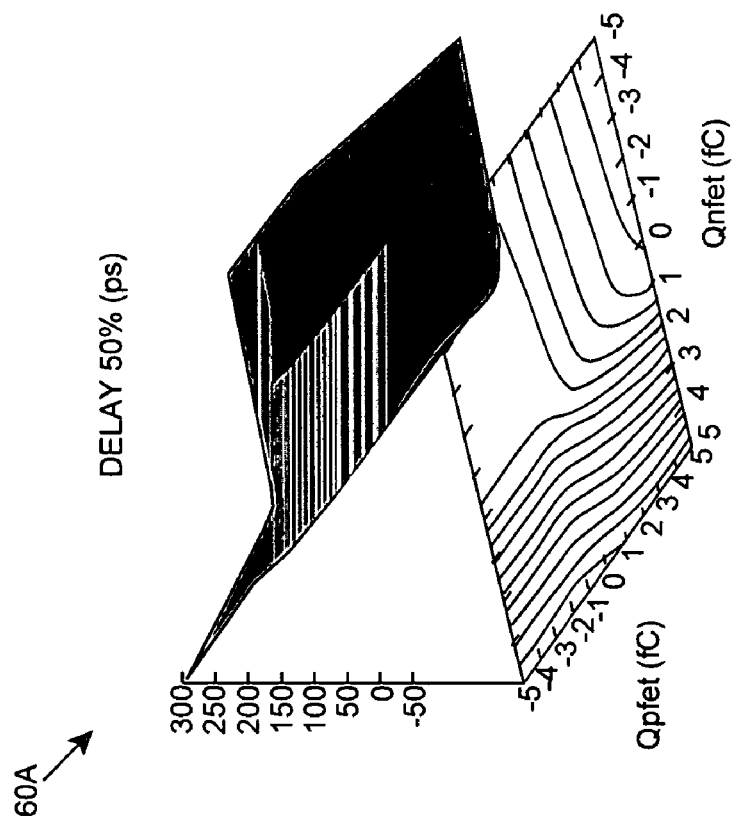

As discussed herein, in step A6 of FIG. 2, examination system 38 (FIG. 1) can examine simulation data 56 (FIG. 1) for various applications. For example, in one embodiment, examination system 38 can investigate a dependence that one or more performance attributes of a standard circuit block have on an initial charge for one or more nodes in the standard circuit block. To this extent, FIGS. 4A-B show illustrative graphs 60A-B of delay and slew, respectively, versus initial charges for the body nodes of each PFET and NFET transistor in a digital inverter standard circuit block in which the output is falling. As illustrated, both the delay and slew performance attributes have a non-trivial dependency on the initial charges (e.g., the history effect). Such a dependency impacts circuit library characterization for the digital inverter. In particular, care must be taken in properly choosing the initial states for the transistors (e.g., the initial charges), to ensure that the extremes of behavior, e.g., the best, worst, and/or typical performance attribute(s) of the digital inverter are properly captured in order to construct an accurate set of behavior models.

Further, examination system 38 (FIG. 1) can examine simulation data 56 (FIG. 1) to analyze the transient response of a Silicon-on-Insulator (SOI)-based digital inverter. To this extent, FIG. 5A shows a graph 62A of the transient response of an SOI inverter, starting with a non-equilibrium body node charge of zero Coulombs. Graph 62A includes the PFET (PB) and NFET (NB) transistor body node voltages superimposed on the output of the digital inverter (OUT). The body nodes are capacitively coupled to the active transistor nodes and their voltages fluctuate accordingly. Due to the history effect, graph 62A shows a longer-term pattern in the body node voltage response. However, graph 62A does not capture the history effect well since the SOI transistor body voltage fluctuates as a function of all other transistor nodes.

Figure 5B:
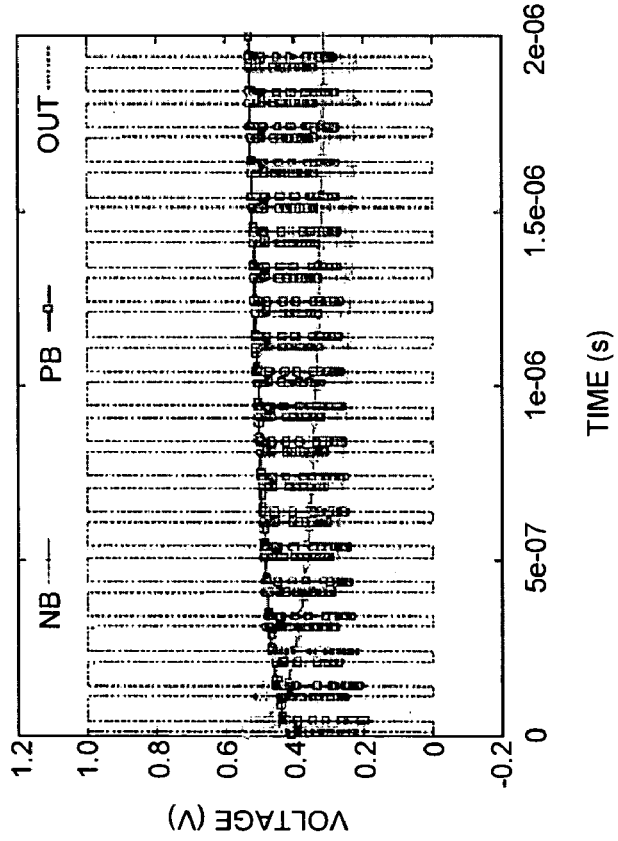
FIGS. 5A-B show graphs of the transient response of an SOI inverter and the body node charge waveforms of PFETs and NFETs of the same SOI inverter, respectively, according to an embodiment of the invention.
Figure 5A:
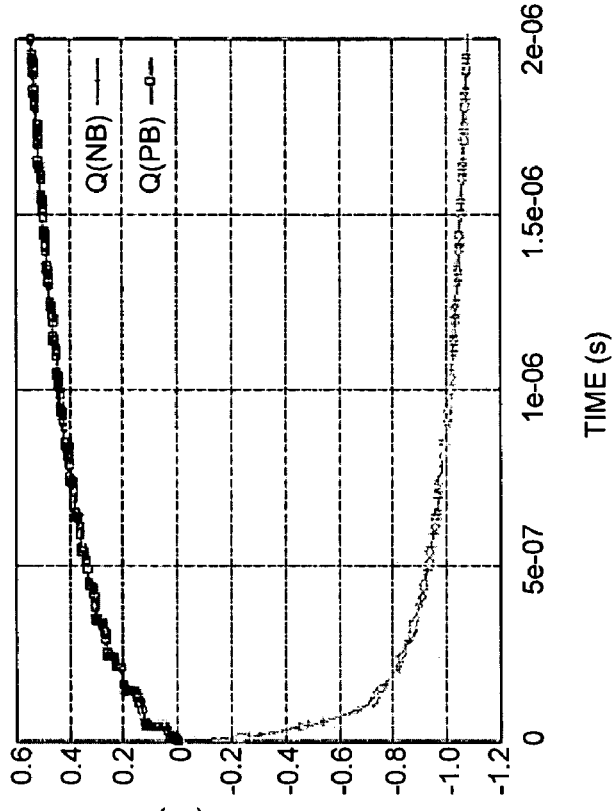

FIG. 5B shows a graph 62B of the body node charge waveforms of the PFET (Q(PB)) and NFET (Q(NB)) of the same SOI inverter. Graph 62B more clearly shows the history effect since, as discussed herein, the total amount of charge captured in the body node only changes very slowly due to the limited amount of direct currents allowed by the high impedance connections. To this extent, the body node charges of all SOI transistors in the circuit can fully capture the state of the circuit, and can serve to model the history effect. In this manner, the state information can be limited to one charge value for each SOI transistor. Moreover, any circuit can be compactly and efficiently initialized to any desired state.

Figure 6:
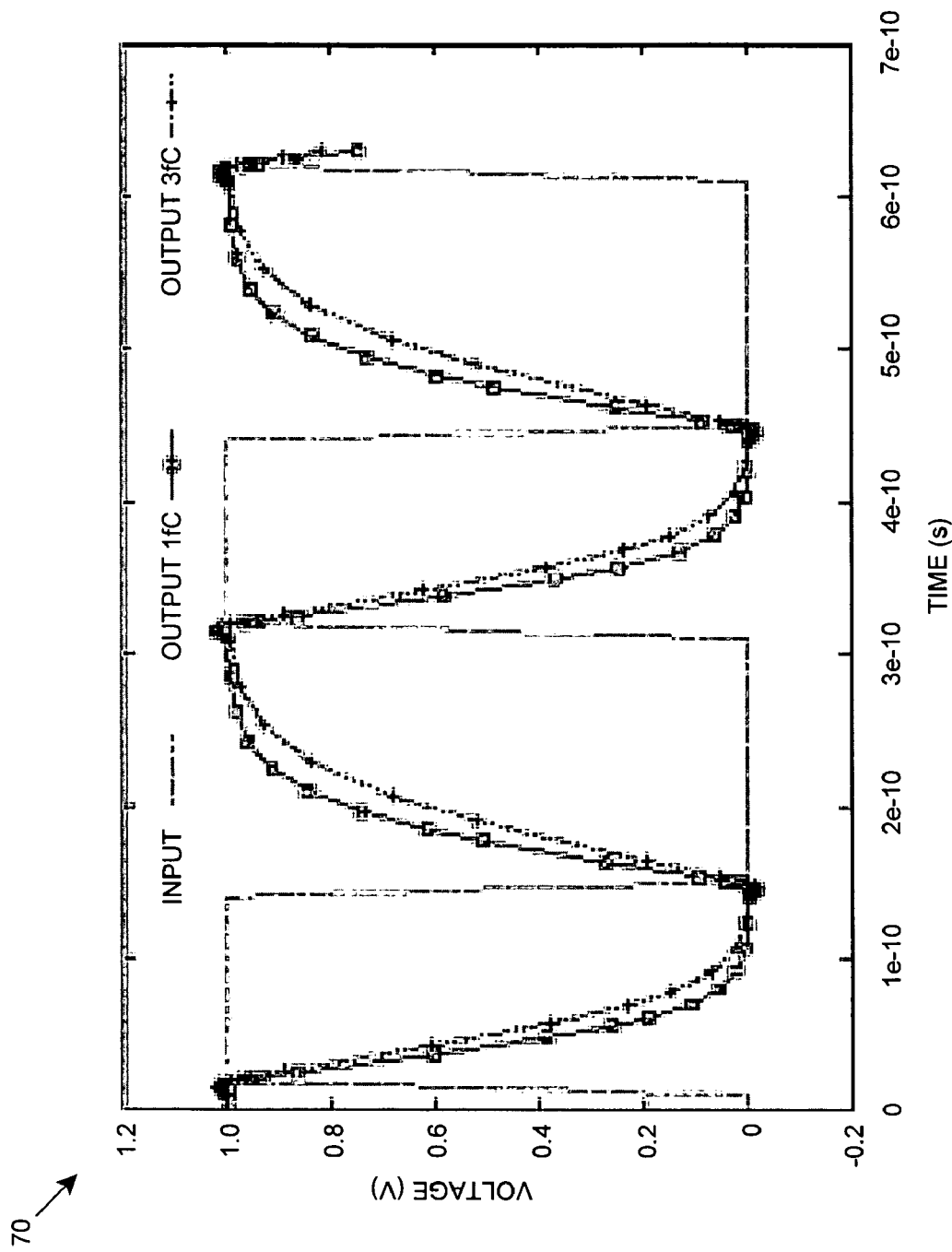
FIG. 6 shows an illustrative graph of an inverter circuit under the two initial charge conditions according to an embodiment of the invention.

Still further, examination system 38 (FIG. 1) can analyze simulation data 56 (FIG. 1) to compare the performance of the circuit with two or more state initializations. For example, in one case, the NFET and PFET body node charges for an inverter circuit can be initialized to −1.0 and 1.0 fC, respectively. In a second case, the NFET and PFET body node charges can be initialized to −3.0 and 3.0 fC, respectively. FIG. 6 shows an illustrative graph 70 of the inverter circuit under the two initial charge conditions, which can correspond to different illustrative history evolutions for the circuit. As graph 70 illustrates, the different body node charges result in significant change in the delay and slew for the same inverter. The 50% delays are calculated as 27 and 36 ps, respectively.

Figure 7:
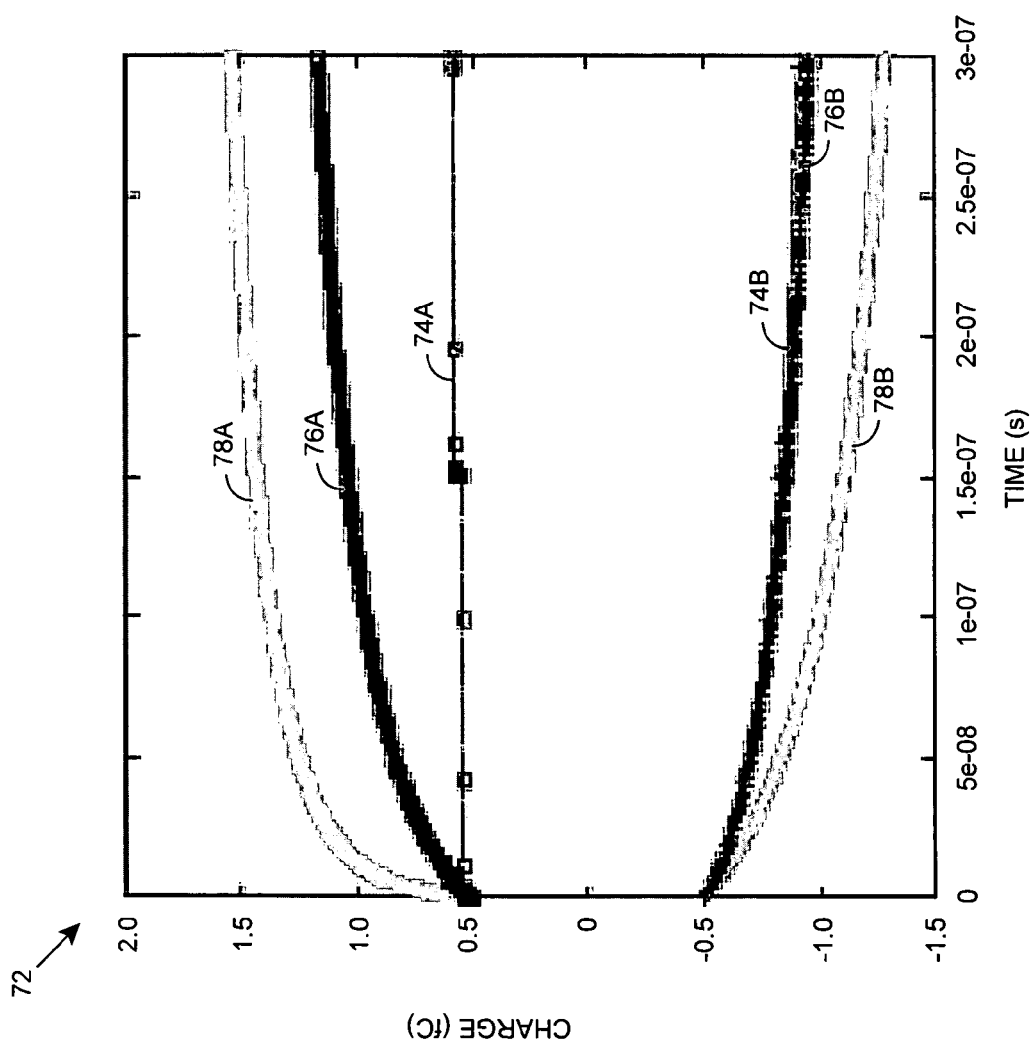
FIG. 7 shows a graph of body node charges for several switching activity levels for an inverter circuit according to an embodiment of the invention.

Still further, examination system 38 (FIG. 1) can analyze simulation data 56 (FIG. 1) to compare the impact of switching activity to body node charges. For example, in one embodiment, three different input cycle series 54 (FIG. 1) were applied to the same inverter circuit comprising the same initial conditions. In each input cycle series 54, the switching activity was varied from once in two cycles to once in one hundred cycles to once in one thousand cycles. FIG. 7 shows a graph 72 of the various switching activity levels. In particular, graph 72 shows the PFET and NFET body node charges, respectively, for the once in two switching activity level 74A-B, once in one hundred switching activity level 76A-B, and the once in one thousand switching activity level 78A-B. Graph 72 further validates the importance of considering the history effect, and as a result, the initial charge, in performance characterization.

VI. Alternatives

While shown and described herein as a method and system for analyzing a circuit, it is understood that the invention further provides various alternative embodiments. For example, in one embodiment, the invention provides a program product stored on a computer-readable medium, which when executed, enables a computer infrastructure to analyze a circuit. To this extent, the computer-readable medium includes program code, such as circuit system 30 (FIG. 1), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 22A (FIG. 1) and/or storage system 22B (FIG. 1) (e.g., a fixed disk, a read-only memory, a random access memory, a cache memory, etc.), as a data signal traveling over a network (e.g., during a wired/wireless electronic distribution of the program product), and/or the like.

In another embodiment, the invention provides a method of generating a system for analyzing a circuit. In this case, a computer infrastructure, such as computer infrastructure 12 (FIG. 1), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 14 (FIG. 1), from a computer-readable medium; (2) adding one or more computing devices to the computer infrastructure; and (3) incorporating and/or modifying one or more existing systems of the computer infrastructure, to enable the computer infrastructure to perform the process steps of the invention.

In still another embodiment, the invention provides a business method that performs the process described herein on a subscription, advertising, and/or fee basis. That is, a service provider, such as an Application Service Provider, could offer to analyze a circuit as described herein. In this case, the service provider can manage (e.g., create, maintain, support, etc.) a computer infrastructure, such as computer infrastructure 12 (FIG. 1), that performs the process described herein for one or more customers. In return, the service provider can receive payment from the customer(s) under a subscription and/or fee agreement and/or the service provider can receive payment from the sale of advertising to one or more third parties.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of analyzing a circuit, the method comprising:
  obtaining a design for the circuit, the design including a set of Silicon-on-Insulator (SOI) transistors and a set of nodes, each node corresponding to a node on a SOI transistor in the set of SOI transistors;
  generating a behavioral model for the circuit, the generating including:
    obtaining an initial charge for a node in the set of nodes based on a non-equilibrium initial condition, the node comprising a body node for a SOI transistor in the set of SOI transistors;
    obtaining an initial charge for at least one of the set of nodes based on a DC equilibrium for the node, wherein none of the at least one of the set of nodes is the body node for the SOI transistor;
    simulating operation of the circuit over a set of input cycles based on the initial charges for the set of nodes; and
    identifying at least one performance attribute for the circuit based on the simulating, the at least one performance attribute comprising at least one of: a delay, a slew, a power consumption, or a leakage, wherein the behavioral model is generated based on the at least one performance attribute;
  determining an effect of a transient event on the circuit, the transient event comprising one of: an electrostatic discharge or a charged particle, the determining including:
    adjusting an initial charge for at least one of the set of nodes to simulate the transient event;

simulating operation of the circuit over the set of input cycles based on the adjusted initial charge for the at least one of the set of nodes; and determining the effect of the transient event for the circuit based on the simulating; and providing the at least one performance attribute, the behavioral model, and the effect of the transient event for use by a user.

2. A system for analyzing a circuit, the system comprising: at least one computing device including:

a system configured to obtain a design for the circuit, the design including a set of Silicon-on-Insulator (SOI) transistors and a set of nodes, each node corresponding to a node on a SOI transistor in the set of SOI transistors;

a system configured to generate a behavioral model for the circuit, the system configured to generate including:

a system configured to obtain an initial charge for a node in the set of nodes based on a non-equilibrium initial condition, the node comprising a body node for a SOI transistor in the set of SOI transistors;

a system configured to obtain an initial charge for at least one of the set of nodes based on a DC equilibrium for the node, wherein none of the at least one of the set of nodes is the body node for the SOI transistor;

a system configured to simulate operation of the circuit over a set of input cycles based on the initial charges for the set of nodes; and a system configured to identify at least one performance attribute for the circuit based on the simulating, the at least one performance attribute comprising at least one of: a delay, a slew, a power consumption, or a leakage, wherein the behavioral model is generated based on the at least one performance attribute;

a system configured to determine an effect of a transient event on the circuit, the transient event comprising one of: an electrostatic discharge or a charged particle, the system configured to determine including:

a system configured to adjust an initial charge for at least one of the set of nodes to simulate the transient event;

a system configured to simulate operation of the circuit over the set of input cycles based on the adjusted initial charge for the at least one of the set of nodes; and a system configured to determine the effect of the transient event for the circuit based on the simulating; and a system configured to provide the at least one performance attribute, the behavioral model, and the effect of the transient event for use by a user.

3. A computer program stored on a physical computer-readable medium, which when executed, enables a computer system to analyze a circuit, the computer program comprising program code for enabling the computer system to implement a method comprising:

obtaining a design for the circuit, the design including a set of Silicon-on-Insulator (SOI) transistors and a set of nodes, each node corresponding to a node on a SOI transistor in the set of SOI transistors;

generating a behavioral model for the circuit, the generating including:

obtaining an initial charge for a node in the set of nodes based on a non-equilibrium initial condition, the node comprising a body node for a SOI transistor in the set of SOI transistors;

obtaining an initial charge for at least one of the set of nodes based on a DC equilibrium for the node, wherein none of the at least one of the set of nodes is the body node for the SOI transistor;

simulating operation of the circuit over a set of input cycles based on the initial charges for the set of nodes; and identifying at least one performance attribute for the circuit based on the simulating, the at least one performance attribute comprising at least one of: a delay, a slew, a power consumption, or a leakage, wherein the behavioral model is generated based on the at least one performance attribute;

determining an effect of a transient event on the circuit, the transient event comprising one of: an electrostatic discharge or a charged particle, the determining including:

adjusting an initial charge for at least one of the set of nodes to simulate the transient event;

simulating operation of the circuit over the set of input cycles based on the adjusted initial charge for the at least one of the set of nodes; and determining the effect of the transient event for the circuit based on the simulating; and providing the at least one performance attribute, the behavioral model, and the effect of the transient event for use by a user.

* * * * *